(12) United States Patent
Choi

(10) Patent No.: US 7,567,784 B2
(45) Date of Patent: Jul. 28, 2009

(54) TUNER, BROADCAST SIGNAL PROCESSING APPARATUS COMPRISING THE SAME, AND BROADCAST SIGNAL PROCESSING METHOD

(75) Inventor: Yong-ho Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 439 days.

(21) Appl. No.: 11/439,201

(22) Filed: May 24, 2006

(65) Prior Publication Data
US 2007/0008438 A1 Jan. 11, 2007

(30) Foreign Application Priority Data
Jul. 5, 2005 (KR) .................... 10-2005-0060397

(51) Int. Cl.
H04B 1/18 (2006.01)
H04B 17/02 (2006.01)
(52) U.S. Cl. .................... 455/132; 455/136; 455/180.2; 455/188.2; 455/250.1; 455/333; 330/118; 330/262; 348/731
(58) Field of Classification Search ......... 455/131–140, 455/179.1–180.2, 188.1–191.1, 250.1–252.1, 455/253.2, 293, 333; 348/731; 330/77, 81, 330/118–123, 262–276
See application file for complete search history.

(56) References Cited

U.S. PATENT DOCUMENTS 3,668,561 A 6/1972 Krupa et al. ............... 332/31 T
4,097,814 A 6/1978 Cohn ......................... 330/286
4,726,072 A * 2/1988 Yamashita et al. ....... 455/189.1

(Continued)

FOREIGN PATENT DOCUMENTS

CN 1183196 5/1998

(Continued)

OTHER PUBLICATIONS

"ICS For Television And Video-Recorder Tuners"; Hohmann H et al.,; TUA 2017 And SDA 3302; Components, Siemens Aktiengesellschaft, Munchen, DE, vol. 25, No. 2, May 1, 1990, pp. 65-69, XP000128903; ISSN: 0945-1137.

(Continued)

Primary Examiner—Simon D Nguyen
(74) Attorney, Agent, or Firm—Roylance, Abrams, Berdo & Goodman, LLP

(57) ABSTRACT

A tuner, a broadcast signal processing apparatus and method, which satisfy reception sensitivity of both terrestrial and cable televisions, when selecting a broadcast signal through a single conversion tuner, are provided. A tuner selects a broadcast signal of a selected channel. The tuner includes an input filter that filters a received broadcast signal into plural frequency bands based on a predetermined frequency band. An amplifier amplifies a second signal having an original phase induced by an output signal of the respective frequency bands, and a first signal having an opposite phase of the second signal, and outputs the signal induced by the amplified first and second signals as an amplification signal of the signal in the respective frequency bands. An inter-stage filter filters a frequency of the broadcast signal corresponding to the selected channel among the amplification signals output from the amplifier. A converter converts the broadcast signal of the frequency filtered by the inter-stage filter.

11 Claims, 4 Drawing Sheets

U.S. PATENT DOCUMENTS

| | | | | |
|---|---|---|---|---|
| 5,742,205 A | * | 4/1998 | Cowen et al. | 330/269 |
| 6,011,438 A | * | 1/2000 | Kakuta et al. | 330/262 |
| 6,125,269 A | * | 9/2000 | Brekelmans | 455/180.1 |
| 6,392,715 B1 | * | 5/2002 | Sato et al. | 348/731 |
| 6,438,361 B1 | * | 8/2002 | Chong et al. | 455/188.1 |
| 6,731,349 B1 | * | 5/2004 | Van Der Wijst | 348/732 |
| 6,842,198 B2 | * | 1/2005 | Suzuki et al. | 348/731 |
| 7,184,733 B2 | * | 2/2007 | Asayama et al. | 455/260 |

FOREIGN PATENT DOCUMENTS

| | | |
|---|---|---|
| CN | 1219802 | 6/1999 |
| EP | 0 678 981 A2 | 4/1995 |
| JP | 61-057134 | 3/1986 |
| JP | 62283721 | 12/1987 |
| JP | 01-269305 | 10/1989 |
| JP | 02-047931 | 2/1990 |
| JP | 06029235 | 4/1994 |
| JP | 09055677 | 2/1997 |
| JP | 11261431 | 9/1999 |
| JP | 2002-204129 | 7/2002 |
| WO | WO 97/25782 | 7/1997 |

OTHER PUBLICATIONS

"ICS And Discrete Semiconductors For TV and VCR Tuner" Baars N; Electronic Components And Applications, Philips. Eindhoven, NL, vol. 9, No. 4, 1989, pp. 240-252 OX000159337.

* cited by examiner

TUNER, BROADCAST SIGNAL PROCESSING APPARATUS COMPRISING THE SAME, AND BROADCAST SIGNAL PROCESSING METHOD

CROSS-REFERENCE TO RELATED APPLICATIONS

This application claims the benefit under 35 U.S.C. §119(a) of Korean Patent Application No. 2005-0060397, filed on Jul. 5, 2005, in the Korean Intellectual Property Office, the entire disclosure of which is hereby incorporated by reference.

BACKGROUND OF THE INVENTION

1. Field of the Invention

The present invention relates to a tuner, a broadcast signal processing apparatus and method. More particularly, the present invention relates to a tuner, a broadcast signal processing apparatus and method, which satisfy reception sensitivity of both terrestrial and cable televisions (TVs) when selecting a broadcast signal through a single conversion tuner.

2. Description of the Related Art

As shown in FIG. 1, a conventional single conversion type tuner having a three band configuration comprises an input tuning filter 4 having a very high frequency low (VHFL) filter 1 to pass a VHF-low frequency band of a received broadcast signal; a very high frequency high (VHFH) filter 2 to pass a VHF-high frequency band of the received broadcast signal; and a ultra high frequency (UHF) filter 3 to pass a UHF band of the received broadcast signal; a signal amplifier 5 having a plurality of MOSFETs F1, F2 and F3 to amplify the signal output from the VHFL filter 1, VHFH filter 2 and UHF filter 3, according to a predetermined amplification degree; an inter-stage tuning filter 9 to filter a frequency of a broadcast signal of a desired channel among signals which are amplified and output from the signal amplifier 5; and a signal converter 10 to convert the signal output from the inter-stage tuning filter 9 into a predetermined intermediate frequency (IF) signal.

In the conventional single conversion tuner, as the input tuning filter 4 and the inter-stage tuning filter 9 comprise a tracking filter, channel distortion is relatively small and noise figure is excellent, though a difference of signal intensity is excessive between channels. Thus, the conventional single conversion tuner is suitable for receiving terrestrial television (TV) broadcast signals.

More signals in the cable TV broadcast environment exist than in the terrestrial broadcast environment. If the single conversion tuner is used in the cable TV environment, harmonic components, which are generated when the signal is amplified, are poorly eliminated due to nonlinear property of the MOSFETs F1, F2 and F3, thereby deteriorating the signal and damaging a picture.

Thus, a double conversion type tuner (not shown) is generally used in the cable TV environment. The double conversion type tuner is excellent in elimination of the harmonic components when the signal is amplified. However, the conventional double conversion type tuner (not shown) is low in the noise figure, thereby lowering picture quality when the terrestrial TV broadcast signal is received. Also, the double conversion type tuner is more expensive than the signal conversion tuner.

SUMMARY OF THE INVENTION

An aspect of embodiments of the present invention is to address at least the above problems and/or disadvantages and to provide at least the advantages described below. Accordingly, an aspect of embodiments of the present invention is to provide a tuner, a broadcast signal processing apparatus and method, which satisfy reception sensitivity of both terrestrial and cable TVs, when selecting a broadcast signal through a single conversion tuner.

Additional aspects and/or advantages of exemplary embodiments of the present invention will be set forth in part in the description which follows and, in part, will be obvious from the description, or may be learned by practice of the present invention.

The foregoing and/or other aspects of exemplary embodiments of the present invention are also achieved by providing a tuner, a broadcast signal processing apparatus and method to select a broadcast signal of a selected channel, where an input filter filters a received broadcast signal into a plurality of frequency bands based on a predetermined frequency band. An amplifier amplifies a second signal having an original phase induced by an output signal of the respective frequency bands, and a first signal having an opposite phase of the second signal and outputs the signal induced by the amplified first and second signals as an amplification signal of the signal in the respective frequency bands. An inter-stage filter filters a frequency of the broadcast signal corresponding to the selected channel among the amplification signals output from the amplifier. A converter converts the broadcast signal of the frequency filtered by the inter-stage filter.

According to another exemplary embodiment of the present invention, the amplifier comprises a push-pull circuit which amplifies the second signal having the original phase induced by the output signal of the respective frequency bands and the first signal having the opposite phase of the second signal, and outputs the signal induced by the amplified first and second signals as the amplification signal of the signal in the respective frequency bands.

According to another exemplary embodiment of the present invention, the push-pull circuit comprises a first transformer to receive the signal in the plurality of frequency bands in a primary coil, and to output the second signal having the original phase induced by the signal supplied to the primary coil and the first signal, having the opposite phase of the secondary signal, to a secondary coil. A first field effect transistor (FET1) receives the first signal in a gate terminal and amplifies the first signal according to a predetermined amplification degree. A second field effect transistor (FET2) receives the second signal in a gate terminal and amplifies the second signal according to the predetermined amplification degree. A second transformer receives the amplified first and second signals in the primary coil and outputs the signal induced by the amplified first and second signals, which are supplied to the primary coil, to the secondary coil.

According to another exemplary embodiment of the present invention, each of the FET1 and FET2 comprises a dual gate (FET) which comprises a second gate terminal to receive a predetermined control signal controlling the predetermined amplification degree.

According to another exemplary embodiment of the present invention, the converter converts the broadcast signal of the frequency, filtered by the inter-stage filter, into an intermediate frequency (IF) signal according to a predetermined conversion setting value, and outputs an automatic gain control (AGC) signal controlling the FET1 and FET2 so the converted IF signal may have a fixed frequency to the second gate terminal.

According to another exemplary embodiment of the present invention, the input filter comprises a VHFL filter to filter a VHFL band, VHFH filter to filter a VHFH band and ultra high frequency (UHF) filter to filter a UHF band of the received broadcast signal, based on a predetermined frequency band.

According to another exemplary embodiment of the present invention, the amplifier comprises a first push-pull amplifier comprising the push-pull circuit, which receives the signal output from the VHFL filter in the primary coil of the first transformer; a second push-pull amplifier comprising the push-pull circuit, which receives the signal output from the VHFH filter in the primary coil of the first transformer; and a third push-pull amplifier comprising the push-pull circuit, which receives the signal output from the UHF filter in the primary coil of the first transformer.

The foregoing and/or other aspects of exemplary embodiments the present invention are also achieved by providing a broadcast signal processing apparatus and method where a broadcast signal is received, and a tuner selects a broadcast signal of a select channel. A processor processes the broadcast signal output from the tuner. A broadcast signal output unit outputs the broadcast signal output from the processor.

BRIEF DESCRIPTION OF THE DRAWINGS

The above and other objects, features, and advantages of certain exemplary embodiments of the present invention will be more apparent from the following description taken in conjunction with the accompanying drawings of which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of the embodiments of the invention. Accordingly, those of ordinary skill in the art will recognize that various changes and modification of the embodiments described herein can be made without departing from the scope and spirit of the invention. Also, descriptions of well-known functions and constructions are omitted for clarity and conciseness.

Figure 2:
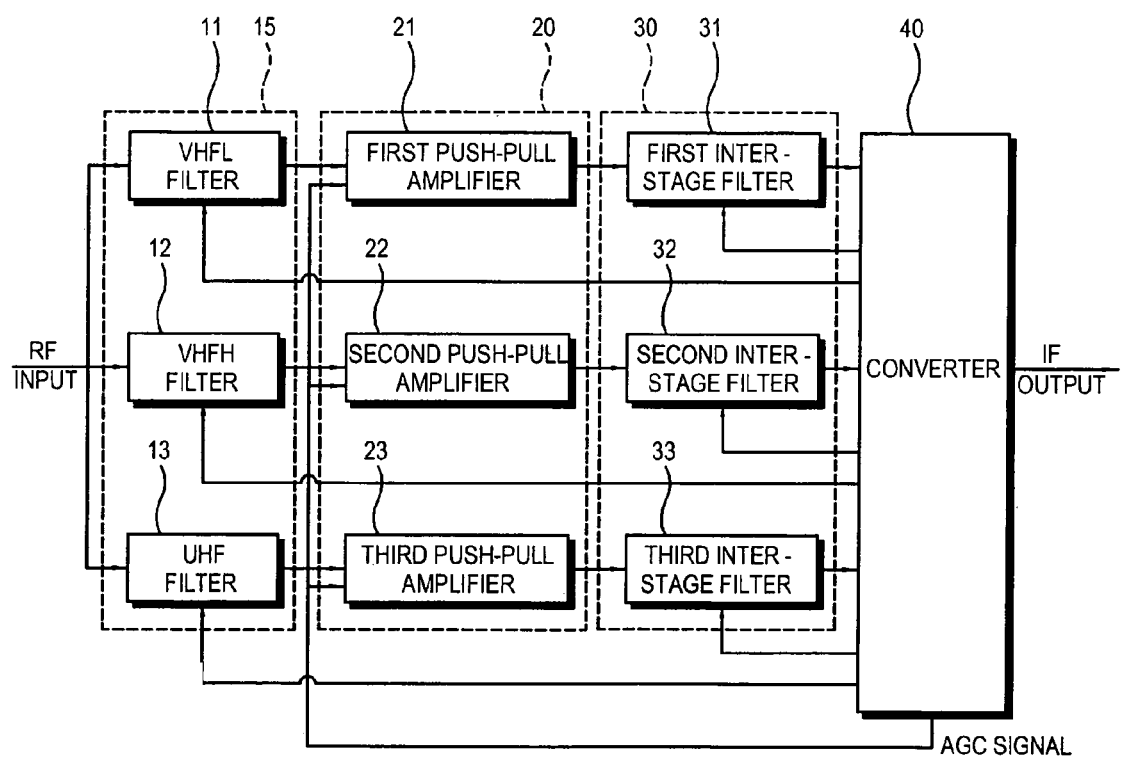
FIG. 2 is a control block diagram of a tuner according to an exemplary embodiments of the present invention.

FIG. 2 is a control block diagram of a tuner according to an exemplary embodiment of the present invention. The tuner according to an exemplary embodiment of the present invention comprises an input filter 15 to filer an input broadcast signal in a plurality of frequency bands, based on a predetermined frequency band. The tuner also comprises an amplifier 20 to amplify a second signal having an original phase induced by the output signal of the respective frequency bands and a first signal having an opposite phase of the second signal, and to output the signal induced by the amplified first and second signals as an amplification signal of the signal in the plurality of frequency bands. The tuner further comprises an inter-stage filter 30 to filter a frequency of a broadcast signal corresponding to a selected channel of the amplification signal output from the amplifier 20. The tuner also comprises a converter 40 to convert the broadcast signal of the frequency filtered by the inter-stage filter 30.

The input filter 15 divides the frequency band of the received broadcast signal based on the predetermined frequency band, to minimize channel distortion when selecting the broadcast signal of the channel among the received broadcast signals. Thus, the input filter 15 may comprise a very high frequency low (VHFL) filter 11 to pass a VHF-low frequency band of a received broadcast signal; a very high frequency high (VHFH) filter 2 to pass a VHF-high frequency band of the received broadcast signal; and a ultra high frequency (UHF) filter 3 to pass a UHF band of the received broadcast signal. The input filter 15 outputs the frequency of the VHF low band, VHF band and UHF band, that is, three band frequencies.

The amplifier 20 amplifies the signal output from the input filter 15 according to a predetermined amplification degree. The amplifier 20 comprises a first push-pull amplifier 21 to amplify the second signal having the original phase induced by an RF signal of the VHFL band output from the VHFL filter 11 and the first signal having the opposite phase of the second signal according to the respective predetermined amplification degree. The amplifier 20 then outputs the signal induced by the amplified first and second signals as the amplification signal of the RF signal. The amplifier 20 also comprises a second push-pull amplifier 22 to amplify the second signal having the original phase induced by the RF signal of the VHFH band output from the VHFH filter 12 and the first signal having the opposite phase of the second signal according to the respective predetermined amplification degree, and to output the signal induced by the amplified first and second signals as the amplification signal of the RF signal. The amplifier 20 further comprises a third push-pull amplifier 23 to amplify the second signal having the original phase induced by the RF signal of the UHF band output from the UHF filter 13 and the first signal having the opposite phase of the second signal according to the respective predetermined amplification degree, and to output the signal induced by the amplified first and second signals as the amplification signal of the RF signal.

Figure 3:
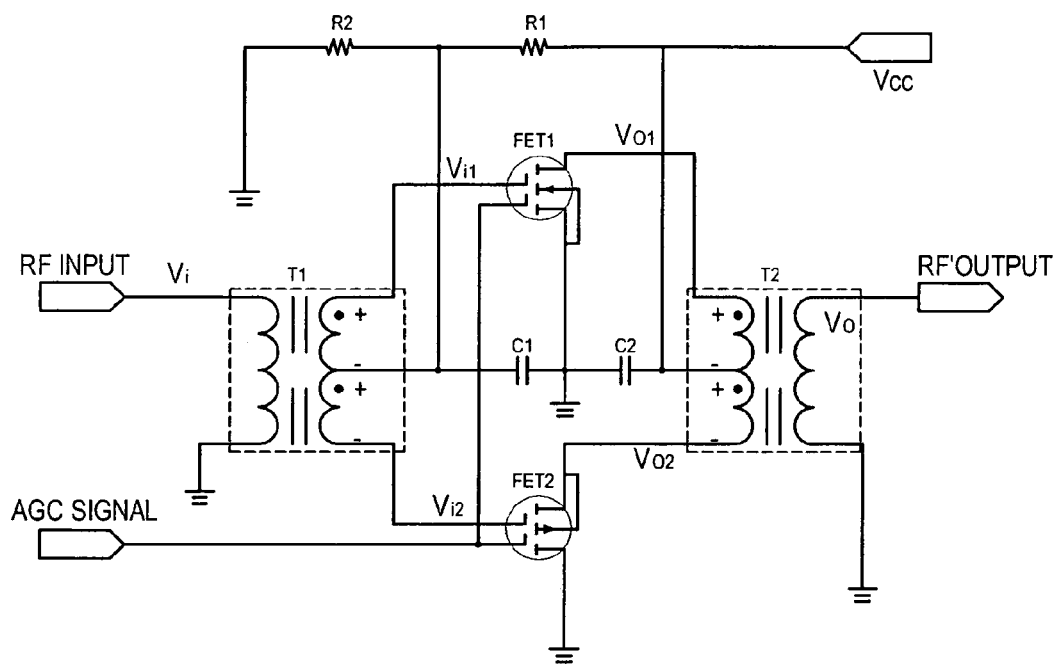
FIG. 3 is a circuit diagram of an amplifier of the tuner in FIG. 2 according to an exemplary embodiments of the present invention.

For example, the first push-pull amplifier 21, second push-pull amplifier 22 and third push-pull amplifier 23 comprise an identical configuration. Referring to FIG. 3, the first push-pull amplifier 21 will be described as an example of the amplifier 20 according to an exemplary embodiment of the present invention.

As shown in FIG. 3, the first push-pull amplifier 21 comprises a first transformer T1 to receive the RF signal of the VHFL band output from the VHFL filter 11 in a primary coil, and to output the first and second signals induced by the RF signal supplied to the primary coil, to a secondary coil. The first push-pull amplifier 21 also comprises a first field effect transistor (FET1) to receive the first signal in a gate terminal and to amplify the first signal according to the predetermined amplification degree. The first push-pull amplifier 21 further comprises a second field effect transistor (FET2) to receive the second signal in the gate terminal and to amplify the second signal according to the predetermined amplification degree. The first push-pull amplifier 21 also comprises a second transformer T2 to receive the first and second signals amplified by the FET1 and FET2 in the primary coil, and to output the RF signal as the amplification signal, induced by the amplified first and second signals supplied by the primary coil, to a secondary coil.

Resistors R1 and R2 provide a bias voltage to prevent cross over distortion of the FET1 and FET2.

When the RF signal of the VHFL band output from the VHFL filter 11 is supplied to the primary coil of the first transformer T1, the first and second signals induced by the frequency of the RF signal are output to the secondary coil of the first transformer T1. Then, the first signal induced by the first transformer T1 has a phase shifted by 180° for the RF signal. The first signal having the phase shifted by 180° is amplified through the FET1. The second signal induced by the first transformer T1 comprises the phase identical to the RF signal, and is amplified through the FET2.

The first and second signals, induced to have the phase shifted by 180° of each other, are amplified through the FET2 and FET1, respectively. The amplified first and second signals are supplied to the primary coil of the second transformer T2. When the amplified first and second signals are supplied to the primary coil of the second transformer T2, one of the phases of the first and second signals is shifted by 180° before the phases are combined to each other. As shown in FIG. 3, the phase of the amplified second signal is shifted by 180° to have the same phase as the first signal when the amplified first and second signals are supplied to the primary coil of the second transformer T2. Then, a RF' signal induced to the secondary coil of the second transformer T2, by the amplified first and second signals having the same phase, is output. That is, the RF' signal refers to an amplified RF signal of the VHF low band output from the VHFL filter 11.

Figure 1:
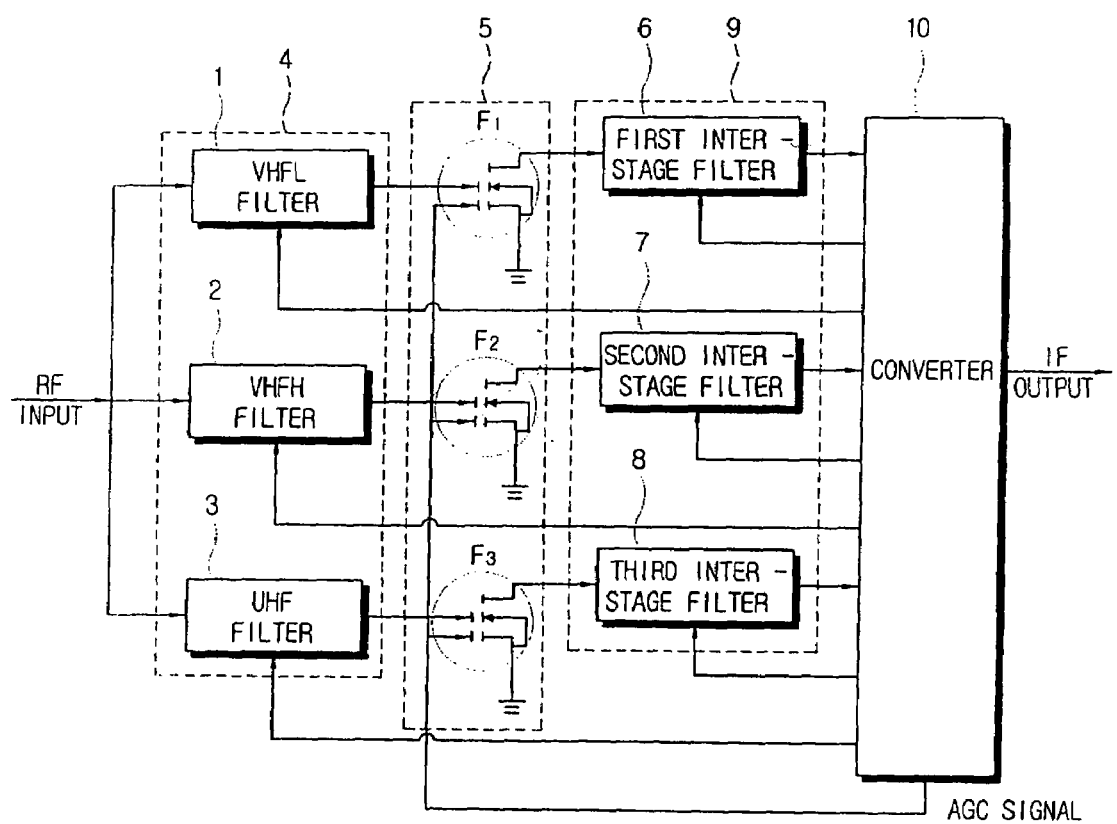
FIG. 1 is a circuit diagram of a conventional tuner.

The amplifier 20 amplifies the first and second signals, which have the phase shifted by 180° of each other, are induced by the RF signal output from the input filter 15. The amplifier 20 then shifts the phase of one of the amplified first and second signals, having the same phase, by 180°. Then, the RF' signal is output by the first and second signals which are amplified and have the same phase. The amplifier 20 may remove harmonic components according to nonlinearity generated by amplification of the RF signal using a single amplifier F1 in FIG. 1.

Hereinafter, a formula for improving linearity when the RF signal is amplified by the first push-pull amplifier 21, according to an exemplary embodiment of the present invention will be described.

The RF signal output from the input filter 15 is an input signal Vi supplied to the primary coil of the first transformer T1. The first signal, having the phase shifted by 180° and induced by the input signal V1 of the primary coil, is Vi1. The second signal, having the same phase as the first signal, is Vi2. As Vi1 and Vi2 are amplified by the FET1 and FET2 to become Vo1 and Vo2, respectively, and Vo2 having the phase shifted from that of Vo1 is supplied to the primary coil of the second transformer T2, the induced/output RF' signal of the secondary coil is Vo. (Here, Vm, A0, A1, A2 . . . are constant.)

$$Vi = Vm \cos wt$$

$$Vi1 = -Vm \cos wt$$

$$Vi2 = Vm \cos wt$$

$$Vo1 = A0 - A1 \cos wt + A2 \cos 2wt - A3 \cos 3wt + A4 \cos 4wt - \ldots$$

$$Vo2 = A0 + A1 \cos wt + A2 \cos 2wt - A3 \cos 3wt + A4 \cos 4wt - \ldots$$

$$Vo = Vo1 - Vo2 = -2(A1 \cos wt + A3 \cos 3wt + A5 \cos 5wt + \ldots$$

As shown above, the amplifier 20 according to an exemplary embodiment of the present invention amplifies the first signal Vi1 and the second signal Vi2 having the phase shifted by 180° of each other and induced by the RF signal Vi output from the input filter 15. The amplifier 20 then outputs the RF' signal induced by the first signal and the second signal of which the phase is shifted, thereby offsetting secondary harmonic components which cause the signal distortion. The amplifier 20 may improve the signal distortion by offsetting the secondary harmonic components of the signal output from the input filter 15 and amplifying the signal distortion according to the predetermined amplification degree.

The FET1 and FET2 may, for example, comprise a dual gate FET, which has a second gate terminal to receive a predetermined automatic gain control (AGC) signal controlling the predetermined amplification degree, from the converter 40. Thus, the FET1 and FET2 may amplify the RF signal input from the input filter 15 according to the amplification degree differentiated by the AGC signal input from the converter 40.

The first push-pull amplifier 21, second push-pull amplifier 22 and third push-pull amplifier 23 are provided in output terminals of the VHFL filter 11, VHFH filter 12 and UHF filter 13, respectively, as shown in FIG. 2. Alternatively, at least one of the push-pull amplifiers 21, 22 and 23 may be provided in at least one of the VHFL filter 11, VHFH filter 12 and UHF filter 13. That is, the first push-pull amplifier 21 is provided in the output terminal of the VHFL filter 11 and the single amplifiers F2 and F3 are provided in the output terminals of the VHFH filter 12 and UHF filter 13, respectively.

The inter-stage filter 30 filters the frequency of the broadcast signal corresponding to the selected channel to improve selectivity of the selected channel among the amplification signals output from the amplifier 20. The inter-stage filter 30 comprises a first inter-stage tuning filter 31 to filter the amplification signal output from the first push-pull amplifier 21. The inter-stage filter 30 also comprises a second inter-stage tuning filter 32 to filter the amplification signal output from the second push-pull amplifier 22. The inter-stage filter further comprises a third inter-stage tuning filter 33 to filter the amplification signal output from the third push-pull amplifier 23.

As the input filter 15 and the inter-stage filter 30 comprise a tracking filter, the distortion of the channel selected in the environment, where a difference of signal integrity is severe between channels, is relatively small and the noise figure is improved so that the input filter 15 and inter-stage filter 30 are suitable for receiving the terrestrial TV broadcast signals.

The converter 40 outputs the filtering signal to the input filter 15 and the inter-stage filter 30 to select the broadcast signal corresponding to the selected channel, and converts the broadcast signal in the frequency filtered by the inter-stage filter 30 into an intermediate frequency (IF) signal according to a predetermined conversion setting value. At this time, the converter 40 outputs the AGC signal to the second gate terminals of the FET1 and FET2 of the respective push-pull amplifiers 21, 22 and 23 to control the amplification degree of the amplifier 20. Then, the IF signal converted by the conversion setting value may have a fixed frequency.

As described above, the tuner according to an exemplary embodiment of the present invention supports the single conversion tuner which is suitable for receiving the terrestrial TV broadcast signal and improves the linearity of the amplification by offsetting the secondary harmonic components through the amplifier 20. Thus, the tuner according to an exemplary embodiment of the present invention may satisfy the sensitivity of both terrestrial and cable TVs.

Figure 4:
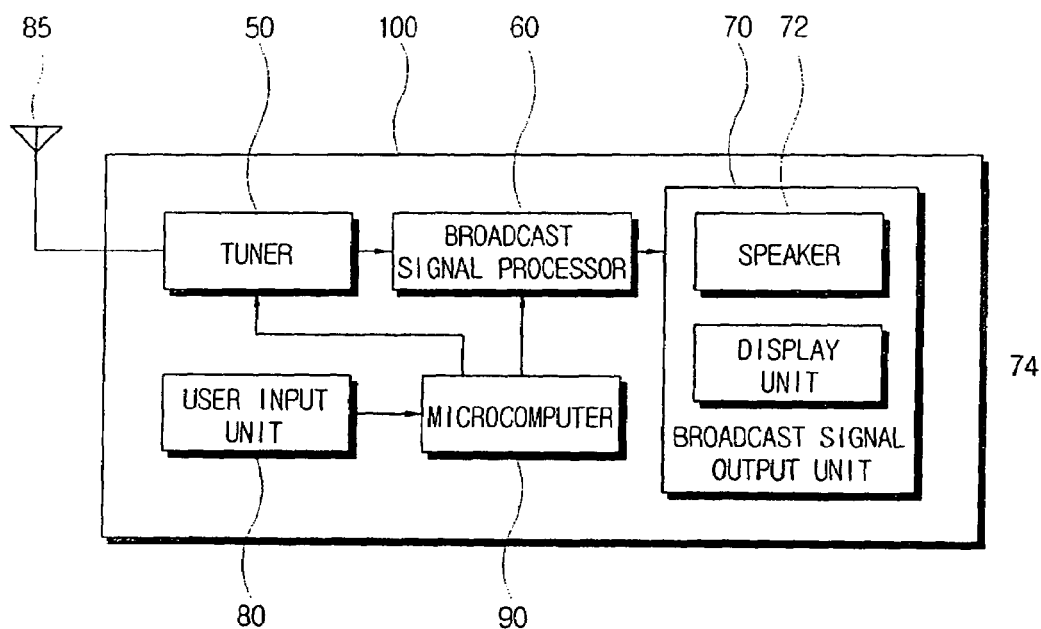
FIG. 4 is a control block diagram of a broadcast signal processing apparatus comprising the tuner in FIG. 2 according to an exemplary embodiment of the present invention.

Referring to FIG. 4, the broadcast signal processing apparatus having the tuner of an exemplary embodiment of the present invention will be described. As an example of the present invention, a TV is provided as the broadcast signal processing apparatus.

As shown in FIG. 4, a TV 100 according to an exemplary embodiment of the present invention comprises an antenna 85 to receive a broadcast signal; a tuner 50 to select the broadcast signal; a broadcast signal processor 60 to process the broadcast signal output from the tuner 50; a broadcast signal output unit 70 to output the broadcast signal output from the broadcast signal processor 60; a user input unit 80 to select a broadcast channel by a user's adjustment; and a microcomputer 90 to control the tuner 50 and the broadcast signal processor 60 to process the broadcast signal of the selected channel, if the channel is selected by the user input unit 80, and to output the broadcast signal through the broadcast signal output unit 70.

The tuner 50 comprises a single conversion tuner having an amplifier 20. The single conversion tuner is suitable for receiving a terrestrial TV broadcast signal and improves linearity of the amplification by offsetting secondary harmonic components through the amplifier 20 when the signal is amplified. Since the tuner 50 is analogous to those described above with reference to FIGS. 2 and 3, a detailed description will be omitted for clarity and conciseness.

The broadcast signal processor 60 processes the broadcast signal output from the tuner 50 to be output through the broadcast signal output unit 70. The broadcast signal processor 60 may comprise an IF demodulator (not shown) to receive an IF broadcast signal of the broadcast signal selected by the tuner 50 to demodulate a predetermined composite video signal from the corresponding IF broadcast signal. The broadcast signal processor 60 also comprises a video decoder (not shown) to divide a bright signal and a color difference signal from the predetermined composite video signal demodulated by the IF demodulator (not shown). If the TV 100 is provided as a digital television (DTV), the broadcast signal processor 60 may comprise a channel decoder (not shown), TP decoder (not shown), and video decoder (not shown) to process a digital broadcast signal to be output through the broadcast signal output unit 70.

The broadcast signal output unit 70 outputs a picture and sound according to the broadcast signal output from the broadcast signal processor 60. The broadcast signal output unit 70 may comprise a display unit 74 to display a picture, and a speaker 72 to output sound.

The microcomputer 90 controls the tuner 50 to select the broadcast signal of the selected channel, if the channel is selected through the user input unit 80, and controls the broadcast signal processor 60 to process the broadcast signal output from the tuner 50 to be output through the broadcast signal output unit 70.

Thus, the broadcast signal processing apparatus according to an exemplary embodiment of the present invention comprises the tuner 50 which supports the signal conversion type suitable for receiving the terrestrial TV broadcast signal and improves linearity of the amplification by offsetting the secondary harmonic components through the amplifier 20 when the signal is amplified. The broadcast signal processing apparatus according to an exemplary embodiment of the present invention satisfies reception sensitivity of both the terrestrial and cable TVs and reduces products cost.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A tuner adapted to select a broadcast signal of a selected channel, comprising:
    an input filter for filtering a received broadcast signal into a plurality frequency bands based on a reference frequency band;
    a push-pull circuit for amplifying a second signal composing an original phase and being induced by at least one of the frequency bands output by the input filter and for amplifying a first signal comprising an opposite phase of the second signal and being induced by the at least one frequency band output by the input filter and for combining the amplified first and second signals to generate an amplification signal of the signal in the respective frequency bands;
    the push-pull circuit including a first field effect transistor (FET) for receiving the first signal in a gate terminal and amplifying the first signal according to an amplification degree and a second FET for receiving the second signal in a gate terminal and amplifying the second signal according to the amplification degree;
    at least one of the first FET and the second FET including a second gate terminal for receiving a control signal controlling the amplification degree;
    an inter-stage filter for filtering a frequency of the broadcast signal corresponding to a selected channel among the amplification signals output from the amplifier; and
    a converter in electrical communication with the second gate of the at least one of the first FET and the second FET for converting the broadcast signal of the frequency filtered by the inter-stage filter and for outputting an automatic gain control (AGC) signal controlling at least one of the first FET and the second FET.

2. The tuner according to claim 1, wherein the push-pull circuit comprises:
    a first transformer for receiving the signal in the plurality of frequency bands in a primary coil, outputting the second signal having the original phase induced by the signal supplied to the primary coil, and outputting the first signal having the opposite phase of the second signal, to a secondary coil; and
    a second transformer for receiving the amplified first and second signals in the primary coil and outputting the signal, induced by the amplified first and second signals which are supplied to the primary coil, to the secondary coil.

3. A broadcast signal processing apparatus adapted to receive a broadcast signal, comprising:
    the tuner according to claim 2;
    a processor for processing the broadcast signal output from the tuner; and
    a broadcast signal output unit for outputting the broadcast signal output from the processor.

4. The tuner according to claim 1, wherein the converter converts the broadcast signal of the frequency filtered by the inter-stage filter into an intermediate frequency (IF) signal according to a conversion setting value, whereby the converted IF signal comprises a fixed frequency to the second gate terminal.

5. A broadcast signal processing apparatus adapted to receive a broadcast signal, comprising:
    the tuner according to claim 4;
    a processor for processing the broadcast signal output from the tuner; and a broadcast signal output unit for outputting the broadcast signal output from the processor.

6. The tuner according to claim 1, wherein the input filter comprises a very high frequency low (VHFL) filter for filtering a VHFL band, a very high frequency high (VHFH) filter for filtering a VHFH band and an ultra high frequency (UHF) filter for filtering a UHF band of the received broadcast signal based on the reference frequency band.

7. The tuner according to claim 6, wherein the amplifier comprises:
   a first push-pull amplifier comprising the push-pull circuit, which receives the signal output from the VHFL filter in the primary coil of the first transformer;
   a second push-pull amplifier comprising the push-pull circuit, which receives the signal output from the VHFH filter in the primary coil of the first transformer; and
   a third push-pull amplifier comprising the push-pull circuit, which receives the signal output from the UHF filter in the primary coil of the first transformer.

8. A broadcast signal processing apparatus adapted to receive a broadcast signal, comprising:
   the tuner according to claim 7;
   a processor for processing the broadcast signal output from the tuner; and
   a broadcast signal output unit for outputting the broadcast signal output from the processor.

9. A broadcast signal processing apparatus adapted to receive a broadcast signal, comprising:
   the tuner according to claim 6;
   a processor for processing the broadcast signal output from the tuner; and
   a broadcast signal output unit for outputting the broadcast signal output from the processor.

10. A broadcast signal processing apparatus adapted to receive a broadcast signal, comprising:
    the tuner according to claim 1;
    a processor for processing the broadcast signal output from the tuner; and
    a broadcast signal output unit for outputting the broadcast signal output from the processor.

11. A method for processing a broadcast signal, the method comprising:
    filtering a received broadcast signal into a plurality frequency bands based on a reference frequency band;
    amplifying a second signal comprising an original phase induced by an output signal of the respective frequency bands amplifying a first signal comprising an opposite phase of the second signal;
    outputting an amplified gain control (AGC) signal for controlling the amplification degree of the amplified first and second signals;
    outputting the signal induced by the amplified first and second signals as an amplification signal of the signal in the respective frequency bands;
    filtering by an inter-stage filter a frequency of the broadcast signal corresponding to a selected channel among the amplification signals output from the amplifier; and
    converting the broadcast signal of the frequency filtered by the inter-stage filter.

* * * * *